Figure 2:
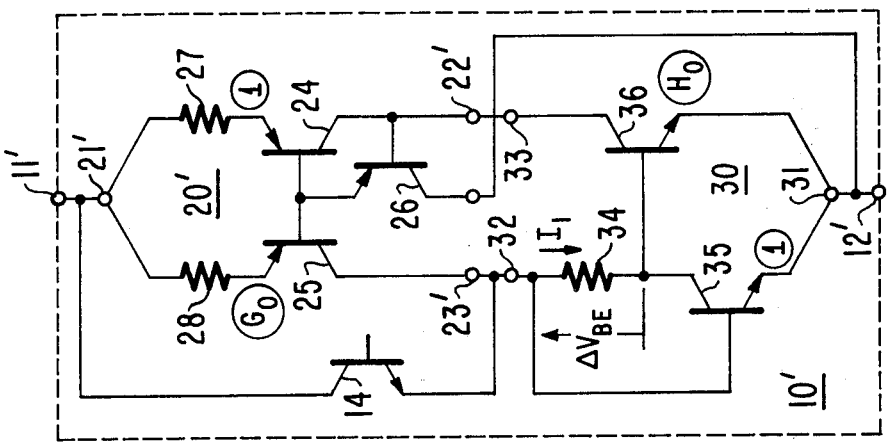

United States Patent [19]

Crowle

[11] 4,063,149
[45] Dec. 13, 1977

[54] CURRENT REGULATING CIRCUITS

[75] Inventor: Brian Crowle, Ashford, England

[73] Assignee: RCA Corporation, New York, N.Y.

[21] Appl. No.: 646,954

[22] Filed: Jan. 7, 1976

[30] Foreign Application Priority Data

Feb. 24, 1975 United Kingdom ............... 07658/75
July 22, 1975 United Kingdom ............... 30627/75

[51] Int. Cl.² .............................................. G05F 1/56
[52] U.S. Cl. ..................................................... 323/4
[58] Field of Search ............................ 323/1, 4, 16, 19; 330/22, 40

[56] References Cited

U.S. PATENT DOCUMENTS

| 3,781,648 | 12/1973 | Owens ..................................... 323/4 |
| 3,831,040 | 8/1974 | Nanba et al. ......................... 323/4 X |
| 3,908,162 | 9/1975 | Marley et al. ........................ 323/1 X |

*Primary Examiner*—A. D. Pellinen
*Attorney, Agent, or Firm*—H. Christoffersen; S. Cohen; A. L. Limberg

[57] ABSTRACT

Two current amplifiers are connected in a regenerative feedback loop. One of them exhibits an exponential decrease in current gain in response to a linear increase in input current, in consequence of which the current level in the loop stabilizes at a predictable level.

11 Claims, 4 Drawing Figures

CURRENT REGULATING CIRCUITS

The present invention relates to current regulating circuits, suitable for inclusion in monolithic integrated circuits, for example. Wheatley, in U.S. Pat. No. 3,629,691, describes a current regulating circuit suitable for inclusion in a monolithic integrated circuit. More particularly, the Wheatley current regulator employs a regenerative feedback loop connection of a current mirror amplifier and another current amplifier similar to a current mirror amplifier. The output transistor in this latter current amplifier is provided with an emitter degeneration resistor that reduces the current gain of the current amplifier with increased input current. At low current levels the open-loop gain of the current amplifiers exceeds unity, so once current flows are initiated in the loop the levels of these currents rise until the loop gain is reduced to unity.

Harford, in U.S. Pat. No. 3,579,133 and Frederiksen, in U.S. Pat. No. 3,659,121, each describe a current source which comprises a current amplifier formed of first and second transistors having an emitter-to-emitter connection at the common terminal of the current amplifier. The first transistor is self-biased, so that the sum of its base and collector currents very nearly equals the input current applied to the current amplifier input terminal. To this end, the input terminal of the current amplifier is direct-coupled to the first transistor base electrode and is galvanically coupled via a resistance to the first transistor collector electrode. A potential drop appears across this resistance because of the first transistor collector current flow therethrough, so the emitter-to-collector potential of this self-biased first transistor is smaller than its base-to-emitter potential. This smaller potential is applied as emitter to-base potential to the second transistor, and the second transistor responds with a relatively small collector current which is caused to flow through the output terminal of the current amplifier. Increased input current to this current amplifier increases the potential drop across the resistance proportionately; the resultant linear decrease in the base-emitter potential of the second transistor causes an exponential reduction in its collector current. Integrated circuit designers have tended to avoid using this type of constant current source because small percentage increase in its input current results in large percentage decrease in its output current.

The present inventor has perceived that the current amplifier described by Harford and Frederiksen is preeminently suitable for combination with another current amplifier in a regenerative feedback loop to provide a current regulator circuit of the same general type as the Wheatley circuit. The exponential decrease in the output current of the current amplifier with linear increase of its input current is not disadvantageous in the current regulating circuitry. Quite the contrary, this characteristic is advantageous since it makes the current levels at which the positive feedback loop stabilizes better defined than in the Wheatley current regulating circuit.

Figure 1:
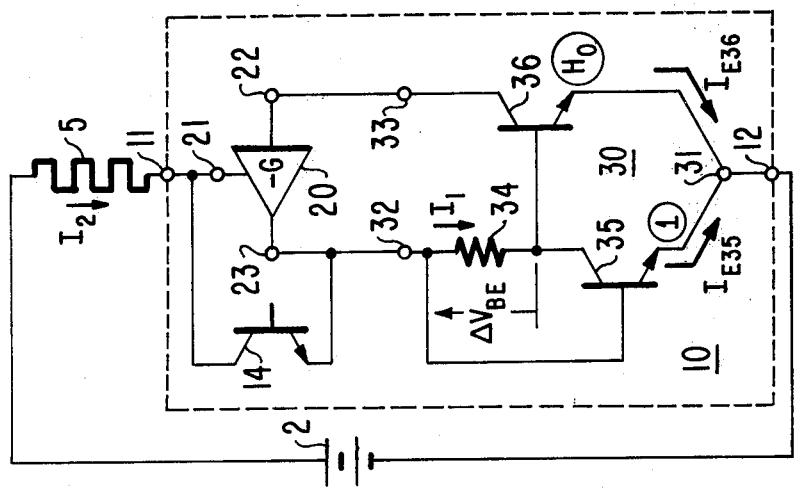
Figure 4:
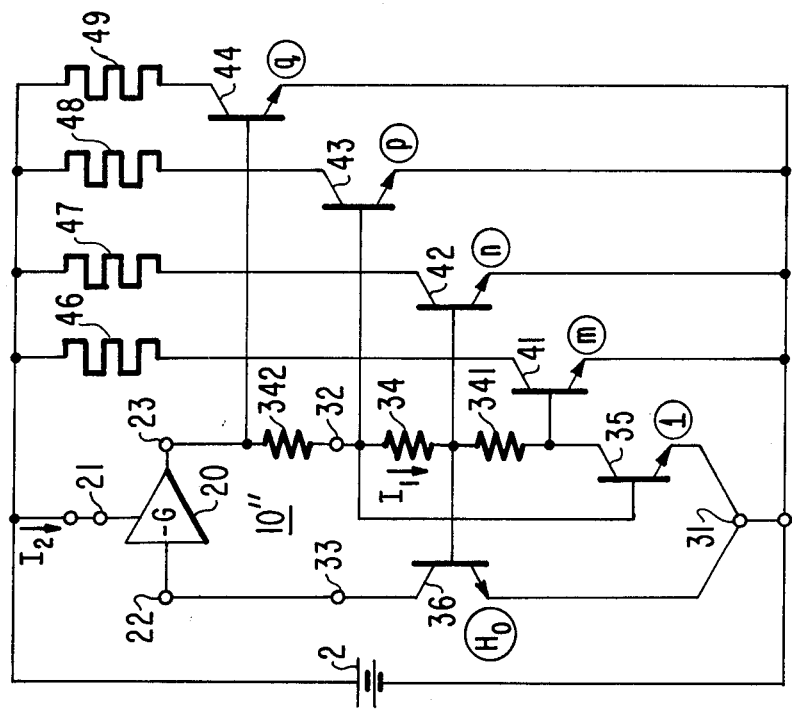
Figure 3:
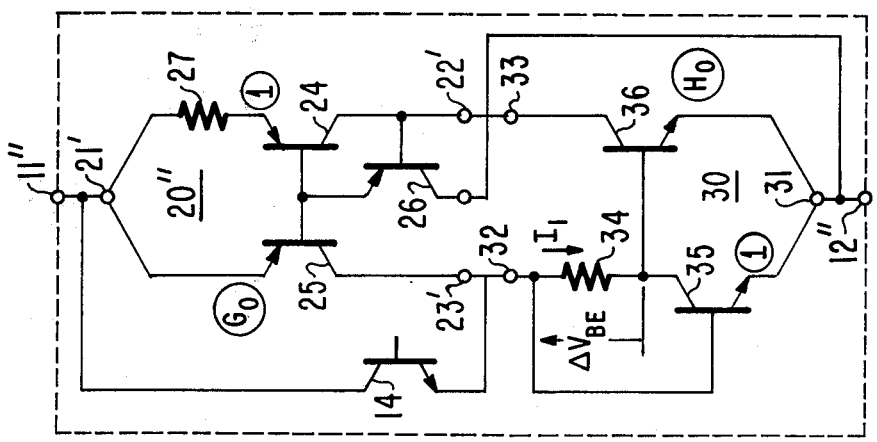

In the drawing:

FIG. 1 is a schematic diagram (partially in block form) of a current regulating circuit embodying the present invention, used to regulate the current flow through a load;

FIG. 2 and 3 are schematic diagrams of representative configurations for the current regulating circuit of FIG. 1, each embodying the present invention; and FIG. 4 is a schematic diagram (partially in block form) of a current regulating circuit embodying the present invention, used to bias first and second current source transistors to provide relatively low-value and relatively high-value constant current sinks.

In FIG. 1, current regulating circuitry 10 has a first terminal 11 and a second terminal 12 between which a supply 2 of operating potential is connected. Terminal 12 is directly connected to the negative terminal of supply 2, and a load 5 with resistive path therethrough connects the positive terminal of supply 2 to terminal 11. Current regulating circuitry 10 comprises a regenerative feedback loop connection of current amplifier 20 and of current amplifier 30, which latter current amplifier is of the type described by Harford and Frederikson. The common terminals 21 and 31 of current amplifiers 20 and 30, respectively, are connected respectively to terminal 11 and to terminal 12 of the current regulating circuit 10. The regenerative feedback loop is formed by (a) the output terminal 23 of current amplifier 20 being galvanically coupled (as shown in FIG. 1, by direct connection) to the input terminal 32 of current amplifier 30 and (b) the output terminal 33 of current amplifier 30 being galvanically coupled (as shown in FIG. 1, by direct connection) to the input terminal 22 of current amplifier 20.

Current amplifier 30 includes, in addition to a resistive element 34, a first transistor 35 and a second transistor 36 so connected that they function as a current mirror amplifier at low current levels where the potential drop across resistive element 34 is less than a millivolt or so. At these low current levels, the current gain of current amplifier 30 is $-H_0$, $H_0$ being a positive number, as between its input terminal 32 and output terminal 33. This is achieved by proportioning the transconductance of transistor 36 to that of transistor 35 in $H_0$-to-one ratio at low current levels. Assuming transistors 35 and 36 to have similar diffusion or implantation profiles this is done by making the effective area of the base-emitter junction of transistor 36 $H_0$ times the effective area of the base-emitter junction of transistor 35.

The current gain of current amplifier 20 is $-G$, where G is a positive number. The product of $H_0G$, the low-current-level open loop gain of the regenerative feedback loop connection of amplifiers 20 and 30, is chosen to exceed unity. Accordingly, a small initial disturbance in the loop (such as the leakage current of open-base transistor 14, for example) will initiate a steady build up of currents in amplifiers 20 and 30. With this build up in current levels, the current gain of current amplifier 30 decreases from $-H_0$ until it reaches a value $-1/G$, at which current levels the unity closed-loop gain condition obtains and the loop remains in equilibrium.

Under these equilibrium conditions, $\Delta V_{BE}$, the difference between the base-emitter potentials $V_{35}$ and $V_{36}$ of transistors 35 and 36, respectively, appearing as a potential drop across resistive element 34, can be determined proceeding from the following basic equation describing transistor action.

$$V_{BE} = (kT/q)\ln I_E/AJ_S \tag{1}$$

where $V_{BE}$ is the base-emitter potential of the transistor, k is Boltzmann's constant,
T is absolute temperature of the transistor base-emitter junction,
q is the charge on an electron,
$I_E$ is the emitter current of the transistor,
A is the area of the transistor base-emitter junction, and
$J_S$ is the emitter current density during saturation of the transistor. Numerical subscripts for these quantities relate them to the transistor having that identification numeral. $J_S$ is assumed the same for integrated transistors 35 and 36 since they are fabricated by the same process steps, and their junction temperatures are caused to be substantially equal by locating them close by each other on the integrated circuit.

$$\Delta V_{BE} = V_{BE35} - V_{BE36} \qquad (2)$$

Substituting from equation 1 into equation 2, equation 3 is obtained.

$$\Delta V_{BE} = (kT/q)\ln(I_{E35}/J_S) - (kT/q)\ln(I_{E36}/H_0 J_S) = (kT/q)\ln(H_0 I_{E35}/I_{E36}) \qquad (3)$$

Equation 4 describes the equilibrium loop condition and substituted into equation 3 yields equation 5.

$$I_{E35}/I_{E36} = G \qquad (4)$$

$$\Delta V_{BE} = (kT/q)\ln G H_0 \qquad (5)$$

The current flow $I_1$ through resistive element 34 with resistance $R_{34}$ is determined in accordance with Ohm's Law.

$$I_1 = \Delta V_{BE}/R_{34} = (kT/q R_{34})\ln G H_0 \qquad (6)$$

$I_1$ is substantially equal to the collector current of transistor 35, assuming the base current of transistor 36 to be negligibly small, which assumption closely approximates actuality if the common-emitter forward current gain, $h_{fe}$, of transistor 36 is of reasonably large value (e.g., more than 30). The collector current of a transistor is $-\alpha$ times its emitter current, $\alpha$ being a factor well-defined to within a percent or so and nearly equal to unity in a transistor with reasonably large $h_{fe}$.

$$I_{E35} = I_1/\alpha_{35} = (kT/q\ \alpha_{35} R_{34})\ln G H_0 \qquad (7)$$

The equilibrium value of $I_{E36}$ is obtained by combining equations 4 and 7 per equation 8.

$$I_{E36} = (I_{E35}/G) = (kT/q\ \alpha_{35} G R_{35})\ln G H_0 \qquad (8)$$

The current $I_2$ flowing through load 5 to terminal 11 of current regulating circuit 10 must by Kirchoff's Law of Currents flow out of terminal 12. $I_2$ can be determined from the following simple node equation.

$$I_{E35} + I_{E36} = I_2 \qquad (9)$$

Substituting equations 7 and 8 into equation 9 and rearranging equation 10 is obtained.

$$I_2 = (1/\alpha_{35} R_{34}) [(G+1)/G] (kT/q)\ln G H_0 \qquad (10)$$

As has been indicated in previous portions of the specification, $\alpha_{35}$ and $H_0$ are both well-defined and k and q are universal constants.

If current amplifier 20 is a current mirror amplifier, G is substantially constant, despite changes in temperature and current levels, and $I_2$ varies proportionally with absolute temperature and inversely with the resistance $R_{34}$ of resistive element 34. Over a limited temperature range $I_2$ tends to be quite constant despite no particular attention being given to the way in which $R_{34}$ changes with temperature. That is, the current levels in the circuit are substantially independent of the $h_{fe}$'s of the transistors. If the resistance $R_{34}$ of resistive element 34 is made to increase with temperature, as is the case with resistive elements made of lightly doped silicon, $I_2$ can be made more constant over a wider temperature range.

As a specific example, current amplifier 20' of FIG. 2 comprises transistors 24 and 25 having respective base-emitter junctions with respective effective areas in 1 to $G_0$ ratio. If the resistances of resistors 27 and 28 are in $G_0$:1 ratio, current amplifier 20' is a current mirror amplifier with a current gain of $-G_0$. Transistor 24 is provided with direct coupled collector-to-base feedback to adjust its base-emitter potential to condition it to supply a collector current equal to the current demand presented to input terminal 22' of the current mirror amplifier. This direct-coupled collector-to-base feedback might be a direct connection, but often includes a current amplifier such as the common-collector amplifier transistor 26 to reduce the effects of the base currents of transistors 24 and 25 in the current gain of amplifier 20'. By proportioning the resistances of resistors 27 and 28 inversely as the transconductances of transistors 24 and 25, respectively, application of the same base potential to transistor 25 as to transistor 24 conditions it for supplying a collector current $G_0$ times as large as that of transistor 25. Alternatively, resistors 27 and 28 may be replaced by direct connections of the emitter electrodes of transistors 24 and 25 to common terminal 21, and current amplifier 20' would still function as a current mirror amplifier.

Current amplifier 20 need not be a current mirror amplifier, however, nor need it be an amplifier with gain that is invariant with input current level either. It is desirable that the current gain of current amplifier 20 be independent of the $h_{fe}$'s of its transistors so that current levels in the current regulating circuit 10 are predictable and have one less temperature-dependent factor determining them. The regulation exhibited by circuit 10 is improved as the amplitude G of the gain of current amplifier 20 is made larger, but achieving large values of G using current mirror amplifiers or other fixed current gain amplifier techniques takes up extensive area on the integrated circuit die. When current amplifier 20 is constructed with bipolar junction transistors rather than field effect transistors, the present inventor has found it to be advantageous to modify current amplifier 20' as to increase the ratio of the resistance of resistor 27 to that of resistor 28 to values larger than $G_0$ in current amplifier 20', which increases the current gain of transistor 20 above $G_0$ as current levels rise. This permits a circuit having smaller values of $G_0$ and $H_0$ (which can usually be realized in a smaller die area), but exhibiting the large G $H_0$ product in the range of current levels where equilibrium is achieved in the positive feedback loop which is required to get good current regulation.

The current amplifier 20" of FIG. 3 results when this modification procedure is carried out fully. A variety of current mirror amplifiers besides those having the structural connections of current amplifier 20' can be used as current amplifier 20 and also these current mirror amplifiers, as modified similarly to the modifications of the current mirror amplifier described above. The important thing to understand about these modified current mirror amplifier structures is that their current gains are still substantially independent of the $h_{fe}$'s of the transistors and do not change with temperature. In the structures of FIGS. 2 and 3 (to which all of these structures are analogous), this comes about because the small difference between the emitter potentials of transistors 24 and 25 is proportional to $\Delta V_{BE}$. Any potential drop across a resistive element 27 is proportional to the $\Delta V_{BE}$ drop across resistive element 34 because substantially the same current flows through them. Since the proportionality between collector currents of transistors 35 and 36 does not change with temperature, the potential drop across resistive element 27 responsive to the collector current of transistor 36 flowing therethrough is proportional to the $\Delta V_{BE}$ drop. In current amplifier 20" of FIG. 3, the potential drop across resistive element 27 proportional to $\Delta V_{BE}$ is the potential difference linearly proportional to T known to be required between the emitter-to-base potentials of transistors 24 and 25 to maintain their collector currents in constant ratio. In current amplifier 20' of FIG. 2 since each of the potential drops across resistive elements 27 and 28, respectively, are proportional to $\Delta V_{BE}$, so is their difference. This difference is equal to the difference between the emitter-to-base potentials of transistors 24 and 25, which must then be in the linear proportion to T known to cause the collector currents of transistors 24 and 25 to be in temperature-independent ratio.

The modified current mirror amplifier structures can replace the current mirror amplifier in current regulating circuits of the type described by Wheatley also, but with less favorable results. This is because in the circuits of FIGS. 2 and 3 the tendency for increased gain of current amplifier 20' or 20" tends to increase $\Delta V_{BE}$ more rapidly and reduce the current gain of current amplifier 30 more rapidly, which improves current regulation. In circuits of the type described by Wheatley on the other hand, the gain degeneration element is in the output circuit of the current amplifier with decreasing current gain with increasing current level. Increasing gain in the other current amplifier with increasing current level tends to make the reduction of loop gain less rapid and impairs regulation of loop currents in or near equilibrium.

FIG. 4 illustrates how readily the current regulation circuit 10 can be adapted for biasing transistors 41, 42, 43 and 44 to demand constant collector currents from supply 2 as supplied via loads 46, 47, 48 and 49, respectively, each of which loads has a direct current path therethrough. Transistors 41, 42, 43 and 44 have base-emitter junctions the effective areas of which are respectively $m$, $n$, $p$ and $q$ times as large as that of transistor 35. Transistor 43 has its base-emitter junction connected in parallel with that of transistor 35, so by equation 1 its collector current will be $p$ times as large as the collector current of transistor 35—that is, essentially $pI$, or $pGI_2/(G+1)$. Transistor 42 will have a collector current $n/H_0$ times that of transistor 36 because of the parallel connection of their base-emitter junctions and the relative effective areas of those junctions. So, transistor 42 will have a collector current $nI_1/G\ H_0$ or $nI_2/(G+1)\ H_0$.

Transistor 41 will have a smaller collector current than transistors 36 and 42 by a proportion determined by the potential drop across resistive element 341. Transistor 44 will have a larger collector current than transistors 35 and 43 by a proportion determined by the sum of the potential drops across resistive elements 34 and 342. These proportions can be calculated by (a) first using the same method used to calculate the proportion between the emitter currents of transistors 35 and 36 to calculate the proportion between the emitter current $I_{E41}$ of transistor 41 or $I_{E36}$, or between the emitter current $I_{E44}$ of transistor 44 and $I_{E35}$ and (b) then multiplying $I_{E41}$ by $\alpha_{41}$ or $I_{E44}$ by $\alpha_{44}$. It is worthwhile to note that the inclusion of resistive elements 341 and 342 does not affect the operation of the current regulation circuit 10" per se, so long as the resistance of resistor 341 is not chosen so large as to cause saturation of transistor 35.

The current regulation circuits described above may be operated as two-terminal current regulators as shown in FIGS. 1, 2 and 3. But also, any of them may have an auxiliary transistor associated with it deriving its base-emitter bias potential from parallel connection with the base-emitter junctions of one of its component transistors such as transistors 24, 25, 34 or 35. A transistor within any of the current regulation circuits may be operated as a signal amplifier, the current regulation being used to determine its quiescent bias conditions. Indeed, a variety of alternative embodiments of the present invention may, in the light of the teaching of this specification, occur to one skilled in the art of integrated-circuit electronic design; and this should be borne in mind in interpreting the scope of the following claims.

What is claimed is:

1. A current regulating circuit comprising:
   a first current amplifier, having input and output circuits and exhibiting a current gain between its input and output circuits which tends to decrease exponentially with increasing current in its input circuit; and
   a second current amplifier having an input circuit to which the output circuit of said first current amplifier is direct coupled and having an output circuit direct coupled to the input circuit of said first current amplifier, thereby to form a loop connection of said first and said second current amplifiers, and exhibiting a current gain between its input and output circuits of a sense which causes said loop connection to be regenerative in nature and of an amplitude which causes current levels in the loop to tend to increase until predetermined levels are achieved whereat the current gain of the loop is reduced to unity.

2. A current regulating circuit as set forth in claim 1 wherein said second current amplifier has a substantially constant gain.

3. A current regulating circuit as set forth in claim 2 wherein said second current amplifier is a current mirror amplifier.

4. A current regulating circuit as set forth in claim 1 wherein said second current amplifier exhibits a current gain which tends to increase exponentially with increasing current in its input circuit at levels below said predetermined level where the current gain of the loop is decreased to unity.

5. A current regulating circuit as set forth in claim 1 wherein said first current amplifier includes:
   first and second junction transistors of the same conductivity type, each having emitter and collector electrodes with an emitter-to-collector path therebetween and having a base electrode, their emitter electrodes being interconnected to share the same potential, the emitter-to-collector paths of said first and said second transistors being included respectively in the input circuit and in the output circuit of said first current amplifier, and a resistive element included in the input circuit of said first current amplifier and serially connected with the emitter-to-collector path of said first transistor, said resistive element having a first end direct coupled to the base electrode of said first transistor and having a second end direct coupled to the base electrode of said second transistor.

6. A current regulating circuit for maintaining a constant current between first and second terminals comprising:

first and second current amplifiers each having an input terminal, an output terminal and a common terminal, said first and said second current amplifiers respectively exhibiting monotonically increasing and monotonically decreasing current gains as the current levels in said current amplifier increase;

a first direct current conductive path between said first terminal and the common terminal of said first current amplifier;

a second direct current conductive path between said second terminal and the common terminal of said second current amplifier;

a third direct current conductive path between the output terminal of said first current amplifier and the input terminal of said second current amplifier; and a fourth direct current conductive path between the output terminal of said second current amplifier and the input terminal of said first current amplifier, said third and said fourth conductive paths connecting said first and said second current amplifiers in a regenerative feedback loop.

7. A current regulating circuit comprising, in combination:

a. a first current amplifier having an input and an output terminal and means for establishing a predictably predetermined current gain of $-G$ between its said input and output terminals, G being positive valued, and b. a second current amplifier having an input terminal to which the output terminal of said first current amplifier is direct coupled, having an output terminal direct coupled to the input terminal of said first current amplifier, having a common terminal for connection to a point of reference potential, having first and second transistors of similar conductivity type each with base and emitter and collector electrodes, having a resistance with first and second ends connected respectively to said first transistor base electrode and to said second transistor base electrode, and galvanically coupled respectively to the input terminal of said second current amplifier and to said first transistor collector electrode, having direct connections of the emitter electrodes of said first and second transistors to its said common terminal for imposing the same emitter potentials on said first and second transistors, and having a galvanic coupling of said second transistor collector electrode to its said output terminal.

8. A current regulating circuit as set forth in claim 7 wherein said first current amplifier is a current mirror amplifier, making G of fixed value.

9. A current regulating circuit as set forth in claim 7 wherein said means for establishing a predictably predetermined current gain of $-G$ includes:

a common terminal for connection to a point of operating potential;

third and fourth transistors of a second conductivity type complementary to said first conductivity type, said third and fourth transistors each having base and emitter and collector electrodes;

first conductive means galvanically coupling said third transistor emitter electrode to said common terminal for connection to a point of operating potential;

second conductive means galvanically coupling said fourth transistor emitter electrode to said common terminal for connection to a point of operating potential;

third conductive means galvanically coupling said third transistor collector electrode to the input terminal of said first current amplifier;

fourth conductive means galvanically coupling said fourth transistor collector electrode to the output terminal of said first current amplifier; and means direct coupling said input terminal of said first current amplifier to each of the base electrodes of said third and fourth transistors.

10. A current regulating circuit as set forth in claim 9 wherein said first conductive means consists of a direct connection without substantial intervening elements and said second conductive means comprises a resistive element.

11. A current regulating circuit comprising:

first and second terminals for application of an operating potential therebetween;

a current mirror amplifier having input and output terminals between which a constant current gain $-G$ is exhibited and having a common terminal connected to said first terminal;

a resistance having a first end to which the output terminal of said current mirror amplifier is galvanically coupled and having a second end;

first and second transistors of similar conductivity type, having respective emitter electrodes directly connected to said second terminal so as to be held at the same potential, having respective base electrodes connected respectively to the first end of said resistance and to the second end of said resistance, and having respective collector electrodes galvanically coupled respectively to the second end of said resistance and to the input terminal of said current amplifier.

* * * * *

Disclaimer

4,063,149.—*Brian Crowle*, Ashford, England. CURRENT REGULATING CIRCUITS. Patent dated Dec. 13, 1977. Disclaimer filed Apr. 10, 1980, by the assignee, *RCA Corporation*.

Hereby enters this disclaimer to claims 1, 2, 3, 5, 7, 8, 9 and 11 of said patent.

[*Official Gazette June 10, 1980.*]